(12) United States Patent
Kim et al.

(10) Patent No.: US 8,659,316 B2
(45) Date of Patent: Feb. 25, 2014

(54) POWER CONTROL CIRCUIT, SEMICONDUCTOR DEVICE INCLUDING THE SAME

(75) Inventors: Hyung Ock Kim, Seoul (KR); Jae Han Jeon, Seoul (KR); Jung Yun Choi, Hwaseong-si (KR); Hyo Sig Won, Suwon-si (KR); Kyu Myung Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/603,878

(22) Filed: Sep. 5, 2012

(65) Prior Publication Data

US 2013/0069690 A1    Mar. 21, 2013

(30) Foreign Application Priority Data

Sep. 16, 2011  (KR) .................. 10-2011-0093638

(51) Int. Cl.
*H03K 17/16* (2006.01)
*H03K 19/003* (2006.01)
*H02J 3/14* (2006.01)
*H01H 35/00* (2006.01)

(52) U.S. Cl.
USPC ............................. 326/33; 307/38; 307/141

(58) Field of Classification Search
USPC ...................................... 326/33; 307/38, 116
See application file for complete search history.

(56) References Cited

U.S. PATENT DOCUMENTS

| 7,696,649 | B2 * | 4/2010 | Frey et al. ................ 307/141 |
| 2007/0223279 | A1 | 9/2007 | Yamashita |
| 2009/0045677 | A1 * | 2/2009 | Frey et al. ................. 307/38 |
| 2010/0164598 | A1 * | 7/2010 | Katou ...................... 327/415 |
| 2011/0196942 | A1 * | 8/2011 | Shukla et al. ............. 709/217 |
| 2013/0099570 | A1 * | 4/2013 | Manohar et al. ............ 307/38 |
| 2013/0173077 | A1 * | 7/2013 | Ye et al. ................... 700/295 |

FOREIGN PATENT DOCUMENTS

| JP | 2008-042357 A | 2/2003 |
| JP | 2007-036899 A | 2/2007 |
| JP | 2007-266045 A | 10/2007 |

* cited by examiner

*Primary Examiner* — Shawki Ismail
*Assistant Examiner* — Dylan White
(74) *Attorney, Agent, or Firm* — Lee & Morse, P.C.

(57) ABSTRACT

A power control circuit is connected between a power supply voltage and a logic circuit to switch power supplied to the logic circuit. The power control circuit includes a plurality of first power gating cells (PGCs) receiving an external mode change signal in parallel, at least one second PGC connected with one first PGC, at least one third PGC connected with the at least one second PGC, and at least one fourth PGC connected with the at least one third PGC. The second power gating cell, the third PGC, and/or the fourth PGC may include a plurality of gating cells. At least one of the second, third, and fourth pluralities has power gating cells connected in series. Each of the first through fourth PGCs switches power supplied in response to the mode change signal.

20 Claims, 20 Drawing Sheets

POWER CONTROL CIRCUIT, SEMICONDUCTOR DEVICE INCLUDING THE SAME

CROSS-REFERENCE TO RELATED APPLICATIONS

This application claims priority under 35 U.S.C. §119(a) from Korean Patent Application No. 10-2011-0093638 filed on Sep. 16, 2011, the disclosure of which is hereby incorporated by reference in its entirety.

BACKGROUND

Embodiments of the inventive concept relate to a method of driving a circuit, and more particularly, to a power control circuit for reducing switching time and securing testability at the transition from a sleep mode to an active mode, a semiconductor device including the same, and a method of driving the same.

A power control circuit (which is also called a power switching circuit) is widely used in integrated circuit design to reduce power consumption. The power control circuit reduces leakage current by cutting off the power supply to a logic circuit in a sleep mode.

However, at the transition from the sleep mode to an active mode, the power control circuit needs to supply power to a block that will be activated again. At this time, current changes rapidly, which leads unnecessary noise in a system. The noise adversely affects the circuit, causing malfunction of the system.

SUMMARY

According to some embodiments of the inventive concept, there is provided a power control circuit, which is connected between a power supply voltage and a logic circuit to switch power supplied to the logic circuit. The power control circuit includes a plurality of first power gating cells configured to receive an external mode change signal in parallel, at least one second power gating cell connected with one first power gating cell among the first power gating cells, a plurality of third power gating cells connected in series with the at least one second power gating cell, and a plurality of fourth power gating cells connected in parallel with a third power gating cell at an end of a serial connection of the third power gating cells.

The power control circuit may further include a buffer connected between the second power gating cell and the third power gating cells to delay transmission of the mode change signal.

The power control circuit may further include a buffer connected between the third power gating cells and a buffer connected between the third power gating cells and the fourth power gating cells to delay transmission of the mode change signal.

When a plurality of second power gating cells are provided, the third power gating cells may be divided into groups that are connected in series with the second power gating cells, respectively.

The power control circuit may further include a test logic configured to be connected with the fourth power gating cells, to receive output signals of the respective fourth power gating cells, and to perform an operation on the output signals.

The test logic may include a logic operator configured to perform an XOR operation on the output signals of the fourth power gating cells.

The power control circuit may further include a voltage sensing circuit connected between the one first power gating cell and the second power gating cell to control connection between the one first power gating cell and the second power gating cell based on a predetermined reference value.

The number of the second through fourth power gating cells may be greater than a predetermined value set for an operation of the power control circuit.

The number of the first power gating cells may be less than a value obtained by dividing a maximum allowable current of the power control circuit by a maximum current flowing in the first power gating cells.

According to other embodiments of the inventive concept, there is provided a semiconductor device including a logic circuit and a power control circuit connected between a power supply voltage and the logic circuit to switch power supply to the logic circuit.

According to further embodiments of the inventive concept, there is provided a power control circuit, which is connected between a power supply voltage and a logic circuit to switch power supplied to the logic circuit. The power control circuit includes a plurality of first power gating cells configured to receive an external mode change signal in parallel, a plurality of second power gating cells connected in series with one first power gating cell among the first power gating cells, at least one third power gating cell connected to a branch from a first node between the second power gating cells, and at least one fourth power gating cell connected in series with the third power gating cell.

The third and fourth power gating cells may be connected in parallel with a second power gating cell following the first node in a serial connection of the second power gating cells. Each of the first through fourth power gating cells may switch the power supply in response to the mode change signal.

According to further embodiments of the inventive concept, there is provided a power control circuit, which is connected between a power supply voltage and a logic circuit to switch power supplied to the logic circuit. The power control circuit may include a plurality of first power gating cells configured to receive an external mode change signal in parallel, at least one second power gating cell connected with one first power gating cell of the plurality of the first power gating cells, at least one third power gating cell connected with the at least one second power gating cell, and at least one fourth power gating cell connected with the at least one third power gating cell. The at least one second power gating cell may include a plurality of second gating cells, the at least one third power gating cells may include a plurality of third gating cells, and/or the at least one fourth power gating cells may include a plurality of fourth gating cells. At least one of the second, third, and fourth pluralities has power gating cells connected in series. Each of the first through fourth power gating cells switches the power supplied in response to the mode change signal.

The at least one second power gating cell may include the second plurality of second power gating cells connected in series with the one first power gating cell.

The at least one third power gating cell may be connected to a branch from a first node between adjacent second power gating cells of the plurality of second power gating cells.

The at least one third power gating cell may include the third plurality of third power gating cells connected in series with the at least one second power gating cell.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1A:
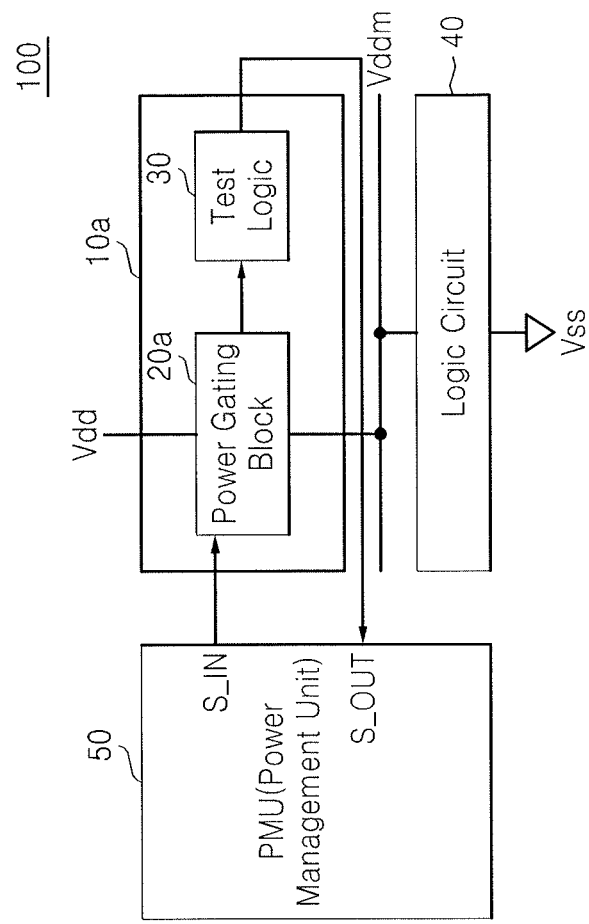
FIGS. 1A through 1C illustrate block diagrams of a semiconductor device including a power control circuit according to some embodiments of the inventive concept.
Figure 1B:
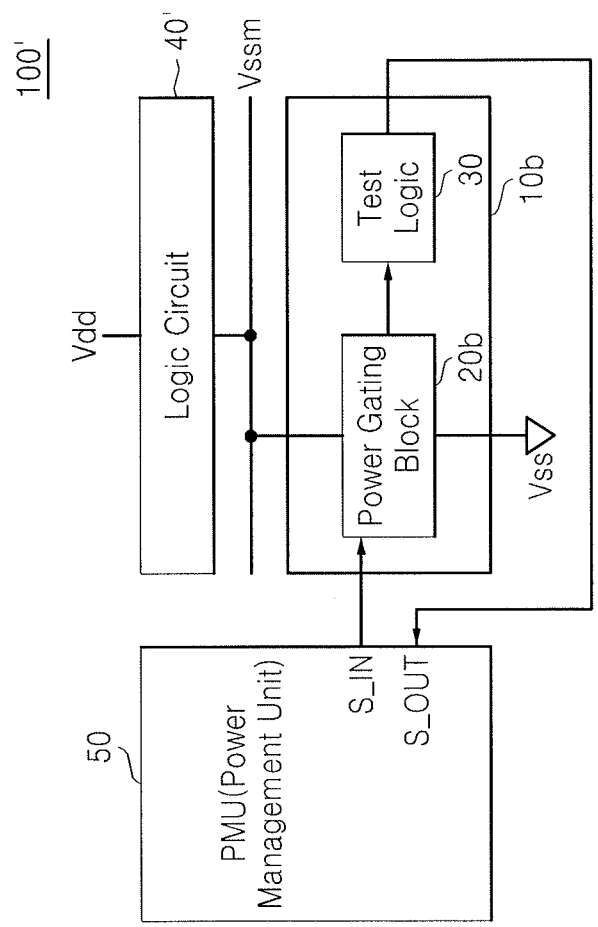
Figure 1C:
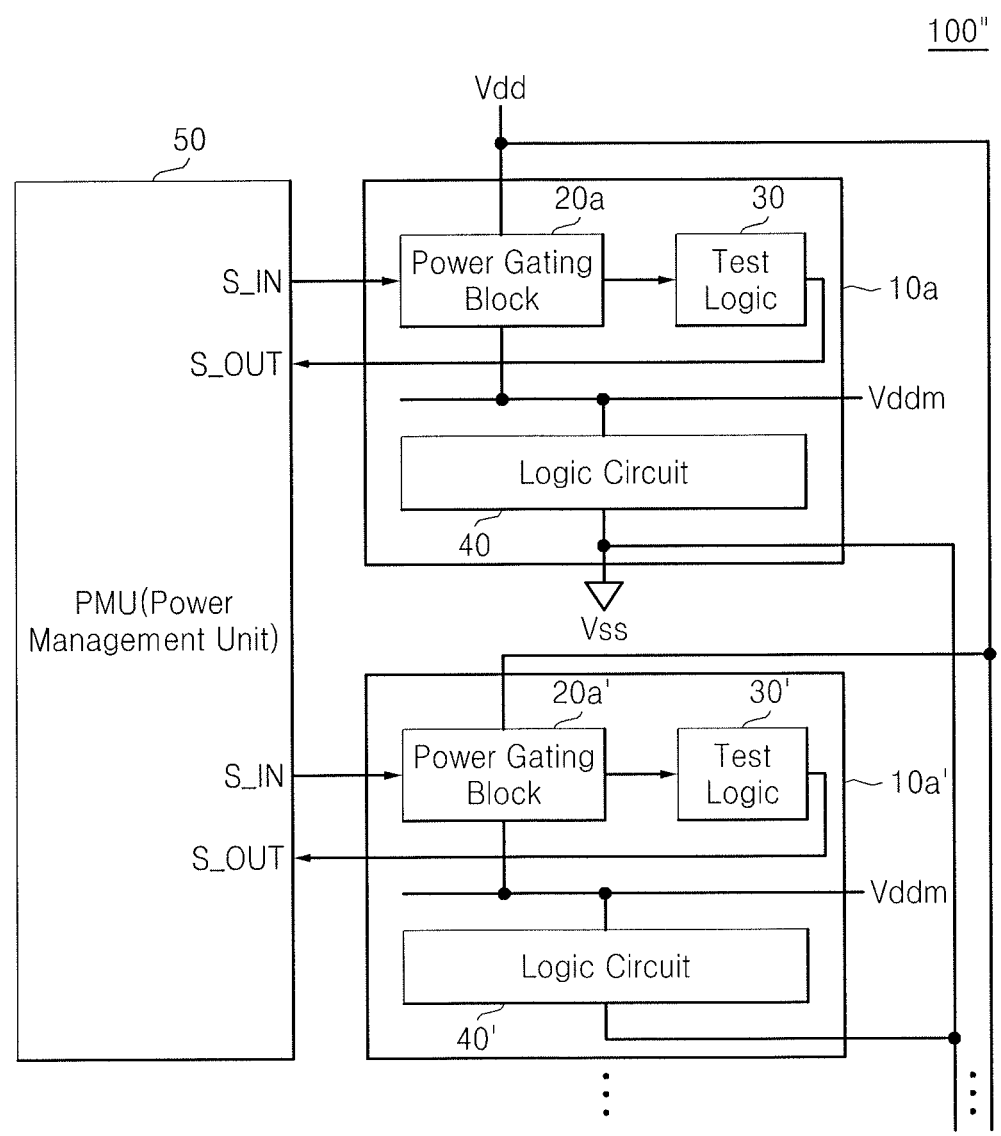

FIGS. 1A through 1C illustrate block diagrams of a semiconductor device including a power control circuit according to some embodiments of the inventive concept. In detail, FIG. 1A shows a semiconductor device 100 including a single power control circuit 10a. FIG. 1B shows a semiconductor device 100' including a single power control circuit 10b. FIG. 1C shows a semiconductor device 100" including a plurality of power control circuits 10a and 10a'.

Referring to FIG. 1A, the semiconductor device 100 includes a logic circuit 40, the power control circuit 10a, and a power management unit (PMU) 50. The power control circuit 10a may include a power gating block 20a including a plurality of power gating cells (PGCs) and a test logic 30. Each of the PGCs included in the power gating block 20a may include at least one power gating transistor. The power gating transistor may be an N-type metal oxide semiconductor (NMOS) transistor or a P-type metal oxide semiconductor (PMOS) transistor.

In detail, when a PGC is disposed between a power supply voltage Vdd and the logic circuit 40, the PGC may include a PMOS transistor. When the PGC is disposed between a ground voltage and the logic circuit 40, the PGC may include an NMOS transistor.

A first terminal of at least one PMOS transistor is connected to the first power supply voltage Vdd and a second terminal thereof is connected to a first virtual power supply voltage Vddm. At this time, a virtual power supply voltage is a power supply voltage applied to the logic circuit 40. A gate of the PMOS transistor may be connected in series to a gate of an adjacent transistor.

A PGC may supply or cut off the first power supply voltage Vdd to the logic circuit 40 according to the conduction of at least one transistor included in the PGC. In other words, the PGC may be included in the power gating block 20a to function as a current switch. When the logic circuit 40 is in an active mode, the PGC is turned on to connect the first power supply voltage Vdd with the first virtual power supply voltage Vddm and supply current to the logic circuit 40. When the logic circuit 40 is in a sleep mode, the PGC is turned off to isolate the first power supply voltage Vdd from the first virtual power supply voltage Vddm.

The active mode may be called an operating mode and the sleep mode may be called a standby mode.

When excessive current is supplied to the logic circuit 40 at the transition from the sleep mode to the active mode, noise may affect peripheral blocks, disturbing their operations. When the semiconductor device 100 does not use the logic circuit 40 to reduce power consumption, the PGC does not supply the first power supply voltage Vdd to the logic circuit 40.

A signal output from the PGC is transmitted to the test logic 30. The test logic 30 may perform an operation based on the signal. The test logic 30 may include an XOR operator. In this case, a logic value output from the test logic 30 may be 1 when the signal is cut off due to a stuck fault.

However, when there are too many signals input to the test logic 30, manufacturing the test logic 30 may be too costly. Accordingly, the number of signals input to the test logic 30 may be determined considering the manufacturing cost and complexity of the test logic 30.

The PMU 50 may send a mode change signal S_IN to the power control circuit 10a. The mode change signal S_IN is a signal for commanding transition from the sleep mode to the active mode or from the active mode to the sleep mode and may be a power gating enable signal. The mode change signal S_IN may be transmitted to a PGC in the power gating block 20a. The current switch of the PGC may be turned on or off in response to the mode change signal S_IN.

The test logic 30 performs an operation on signals received from the last PGC and outputs a signal S_OUT to the PMU 50. The PMU 50 compares the signal S_IN with the signal S_OUT and determines which PGC has had a stuck fault.

The logic circuit 40 is connected between the first virtual power supply voltage Vddm and a second power supply voltage Vss, and performs a predetermined logic operation.

Referring to FIG. 1B, the semiconductor device 100' includes a logic circuit 40', the power control circuit 10b, and the PMU 50. The structure illustrated in FIG. 1B is similar to that illustrated in FIG. 1A, thus differences therebetween will be described to avoid redundancy.

Referring to FIG. 1B, the power control circuit 10b is positioned opposite to the power control circuit 10a illustrated in FIG. 1A. In other words, while the power control circuit 10a illustrated in FIG. 1A is connected between the first power supply voltage Vdd and the first virtual power supply voltage Vddm, the power control circuit 10b illustrated in FIG. 1B is connected between a second virtual power supply voltage Vssm and the second power supply voltage Vss. The second power supply voltage Vss may be a ground voltage.

A power gating block 20a may include a plurality of PGCs each of which may include at least one power gating transistor. At this time, the power gating transistor may be implemented by an NMOS transistor. A first terminal of the at least one NMOS transistor is connected to the second power supply voltage Vss and a second terminal thereof is connected to the second virtual power supply voltage Vssm.

A PGC may supply or cut off the second power supply voltage Vss to the logic circuit 40' according to the conduction of at least one transistor included in the PGC. The logic circuit 40' is connected between the first power supply voltage Vdd and the second virtual power supply voltage Vssm and performs a predetermined logic operation.

In other embodiments, both of the power control circuits 10a and 10b illustrated in FIGS. 1A and 1B may be provided for the logic circuits 40 and 40'. In other word, the logic circuits 40, 40' may be connected between the first virtual power supply voltage Vddm and the second virtual power supply voltage Vssm.

Referring to FIG. 1C, the semiconductor device 100" includes a plurality of power control circuits 10a and 10a', a plurality of logic circuits 40 and 40', and the PMU 50. The power control circuits 10a and 10a' may have the same structure. However, the inventive concept is not restricted to the current embodiments in which only two power control circuits 10a and 10a' are provided.

For simplicity and clarity, only the power control circuit 10a will be referenced in the further detailed description provided below. However, it will be understood that the following applies to any of the configurations illustrated in FIGS. 1A to 1C.

Figure 2:
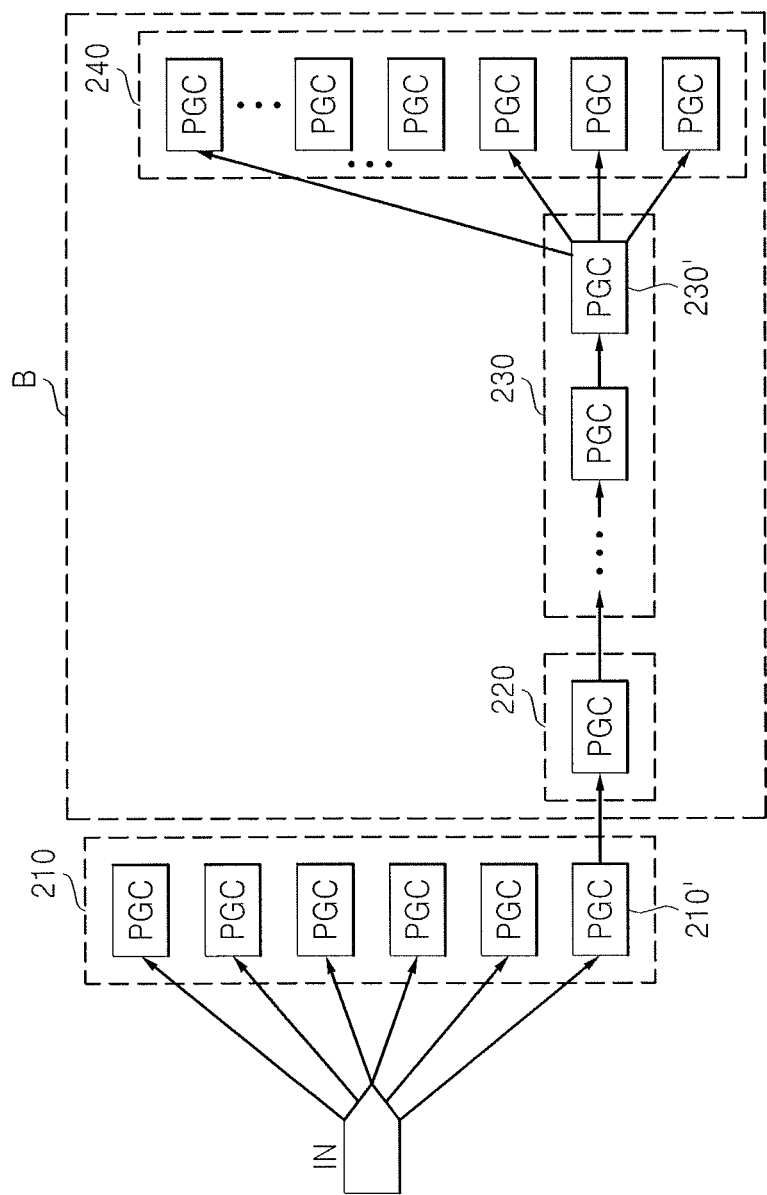
FIG. 2 illustrates a diagram showing the disposition and the signal flow of power gating cells included in a power control circuit according to some embodiments of the inventive concept.
Figure 3:
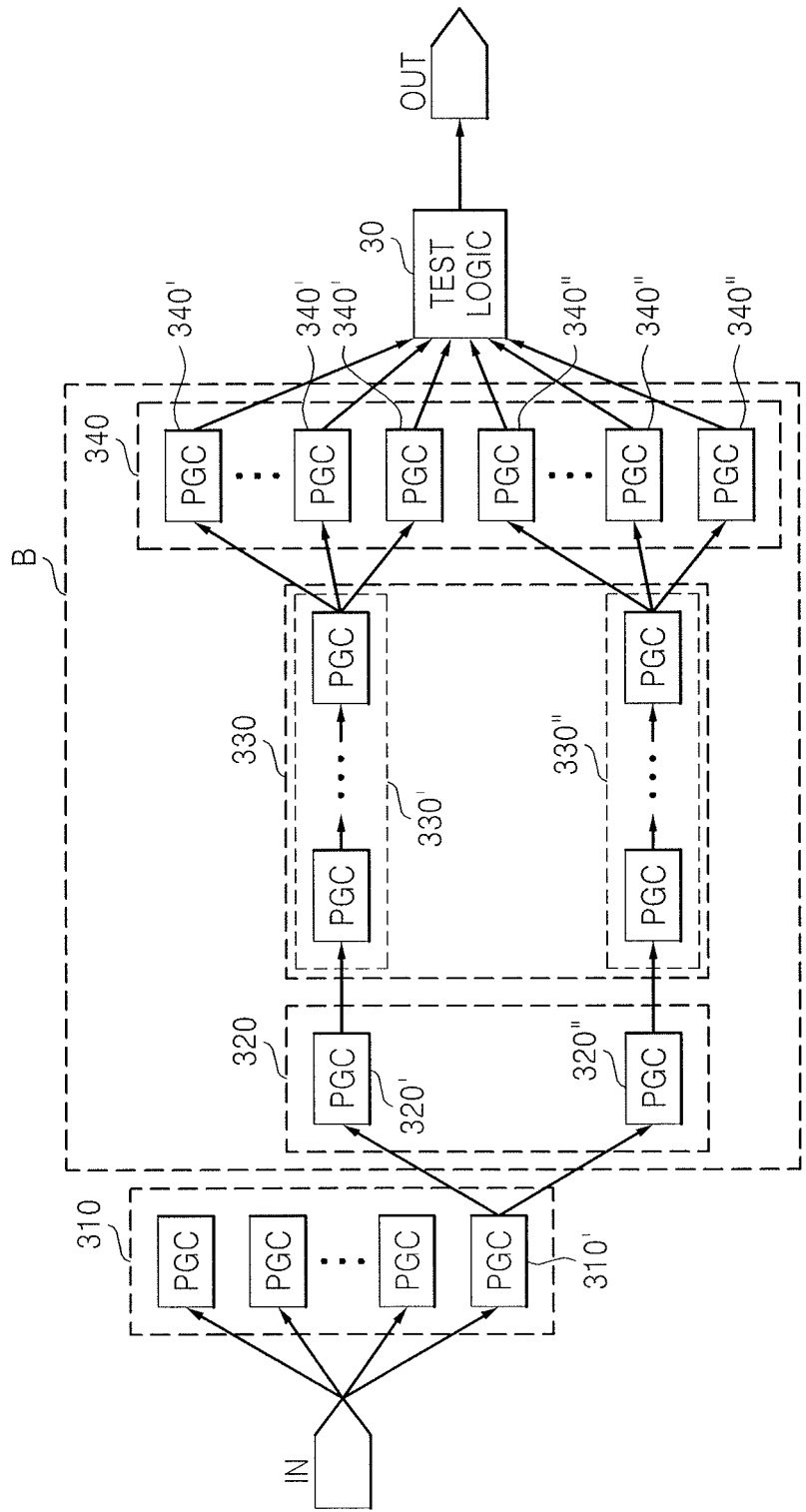
FIG. 3 illustrates a diagram showing the disposition and the signal flow of power gating cells included in a power control circuit according to other embodiments of the inventive concept.

FIGS. 2 and 3 are diagrams showing the disposition and the signal flow of PGCs included in power control circuits according to different embodiments of the inventive concept. Referring to FIG. 2, the power control circuit may include a plurality of PGCs. The PGCs may be connected in series or parallel with one another.

In detail, the plurality of PGCs may include a plurality of first PGCs 210 receiving the mode change signal S_IN in parallel, at least one second PGC 220 connected with one of the first PGCs 210, a plurality of third PGCs 230 connected in series with at least one of second PGCs 220, and a plurality of fourth PGCs 240 connected with the last one of the third PGCs 230 to output a plurality of output signals based on the mode change signal S_IN.

The first PGCs 210 simultaneously receive the mode change signal S_IN. Accordingly, current switches included in the first PGCs 210 are simultaneously turned on or off. For instance, at the transition from the sleep mode to the active mode, the current switches are simultaneously turned on, so that the first PGCs 210 simultaneously supply current to the logic circuit 40.

Conventionally, PGCs are connected in series with one another, so that current switches are sequentially turned on. Accordingly, it takes long time to make transition from the sleep mode to the active mode.

However, according to the current embodiments of the inventive concept, PGCs receive the mode change signal S_IN in parallel and supply current simultaneously, thereby reducing time taken to make mode transition. The number of the first PGCs 210 connected in parallel may be adjusted so that the magnitude of wake-up current generated at the mode transition can be appropriately maintained.

In detail, when "I" denotes a saturation current of a current switch included in each of the PGCs and "W" denotes a wake-up current, the number of the first PGCs 210 is less than or equal to W/I. The wake-up current W may be a maximum allowable current of the power control circuit 10a and the saturation current I may be a maximum current flowing in the first PGCs 210. Accordingly, the number of the first PGCs 210 is less than or equal to a value obtained by dividing the maximum allowable current of the power control circuit 10a by the maximum current flowing in the first PGCs 210.

Only one of the first PGCs 210 is connected with the second PGC 220. This is because it is inefficient to test all PGCs. The test logic 30 performs an operation on connection to only one of the first PGCs 210. First PGCs 210 that are not connected with the second PGC 220 function to supply current to the logic circuit 40.

Wake-up current decreases when the number of the first PGCs 210 that are turned on simultaneously decreases. Accordingly, even when a problem occurs in the first PGCs 210 that are not connected with the second PGC 220, the limit of the wake-up current is secured.

The second PGC 220 is connected with a first PGC 210' among the first PGCs 210 and receives the mode change signal S_IN via the first PGC 210'. In response to the mode change signal S_IN, a current switch included in the second PGC 220 is turned on or off.

The third PGCs 230 are connected in series with the second PGC 220.

The fourth PGCs 240 are connected with a third PGC 230' positioned at the end of the group of the third PGCs 230 connected in series with one another. The fourth PGCs 240 receive the mode change signal S_IN that has been transmitted via the first PGC 210', the second PGC 220, and the third PGCs 230. The fourth PGCs 240 respectively output a plurality of output signals based on the received mode change signal S_IN.

The fourth PGCs 240 may be connected in parallel with one another.

The power control circuit illustrated in FIG. 3 is similar to that illustrated in FIG. 2, thus differences therebetween will be described. While there is only one second PGC 220 in the power control circuit illustrated in FIG. 2, a plurality of second PGCs 320 are included in the power control circuit illustrated in FIG. 3.

In other words, FIG. 3 shows a case in which a plurality of the second PGCs 320 is provided. The second PGCs 320" may be connected with a first PGC 310' among a plurality of first PGCs 310 and simultaneously receive a signal from the first PGC 310'. Like current switches included in the first PGCs 310, current switches included in the second PGCs 320' may be simultaneously turned on or off. For instance, when the second PGCs 320 are simultaneously turned on, a relatively large amount of current can be simultaneously supplied to the logic circuit 40 through the current switches.

A third PGC 330 may be connected in series with at least one second PGC 320' or 320" among the second PGCs 320. When a plurality of the second PGCs 320 are provided, a plurality of groups of third PGCs 330 is respectively connected in series with the plurality of the second PGCs 320. Accordingly, the third PGCs 330 may be divided into the plurality of third PGC groups 330' and 330" respectively connected with the second PGCs 320' and 320". In the embodiment illustrated in FIG. 3, two second PGCs 320' and 320" are provided and, therefore, the third PGCs 330 are divided into two groups 330' and 330". However, more than two second PGCs 320 with a corresponding number of groups of third PGCs may be provided.

A fourth PGC 340 is connected with a third PGC 330 positioned at the end of the third PGC groups 330' or 330" in which a plurality of third PGCs 330 are connected in series with each other. The fourth PGC 340 receives the mode change signal S_IN transmitted via the first PGC 310', the second PGC 320' or 320", and the third PGCs 330 in the group 330' or 330". A plurality of fourth PGCs 340 output a plurality of output signals, respectively, based on the mode change signal S_IN.

The fourth PGC 340 may be connected in parallel with the third PGC. As illustrated in FIG. 3, when a plurality of the second PGCs 320 is provided, the number of third PGCs 330 positioned at the end, i.e., the number of PGC groups 330', 330", is the same as the number of second PGCs 320.

In the embodiments illustrated in FIG. 3, the two second PGCs 320' and 320" are provided and the third PGCs 330 are divided into the two groups 330' and 330". Accordingly, the number of third PGCs 330 connected with any one of the fourth PGC 340 is the same as the number of the second PGCs 320.

When a plurality of second PGCs 320 is provided, fourth PGCs 340 are respectively connected with one of a plurality of third PGCs 330 positioned at the end. In this case, a plurality of fourth PGCs 340 connected with one third PGC 330 may be connected in parallel with the third PGC 330.

In other words, fourth PGCs 340' connected with one third PGC positioned at the end among third PGCs in one group 330' may be connected in parallel with each other. Fourth PGCs 340" connected with another third PGC positioned at the end among third PGCs in another group 330" may be connected in parallel with each other.

Signals output from the fourth PGCs 340' or 340" are transmitted to the test logic 30. The test logic 30 may perform an operation on the signals and output a result value.

The number of all PGCs except for the first PGCs 210, 310 may be determined depending on the minimum number of current switches necessary to maintain a proper operation of a circuit in the active mode.

The number of all PGCs except for the first PGCs 210 or 310, i.e., the sum of the numbers of the second PGCs 220, 320, the third PGCs 230, 330, and the fourth PGCs 240, 340 may be greater than a predetermined value set for the operation of the power control circuit 10a.

In detail, when "B" denotes the number of all PGCs except for the first PGCs 310 and "C" denotes the minimum number of current switches necessary for the proper operation of the power control circuit 10a, B+1 may be greater than C. According to current embodiments, since one of the first PGCs 210 or 310 is used to transit the mode change signal, 1 is added to B. In other words, only a number of first PGCs 210' or 310' connected with the second PGC 220 or the second PGCs 320 is added to B. In the inventive concept, testability is secured for B+1 PGCs, which are enough to test current switches necessary in the active mode.

The connections of PGCs illustrated in FIGS. 2 and 3 are just examples. For example, a plurality of PGCs respectively connected in series with the fourth PGCs 240 may be further provided and the test logic 30 may perform an operation on mode change signals S_IN received from these PGCs.

The second PGC 220 or 320 may be connected with a plurality of first PGCs 210, 310 instead of being connected with only one first PGC 210' or 310'. In this case, a third PGC 230 may be connected in series with each of the second PGCs 220, 320 and then connected with an appropriate number of fourth PGCs 240, 340.

The number of the fourth PGCs 240, 340 connected in parallel with each other may be determined depending on the possibility and cost of realizing the test logic 30 and the maximum allowable current of the test logic 30.

A buffer or a voltage sensing circuit may be disposed between PGCs, which will be described later.

Figure 4:
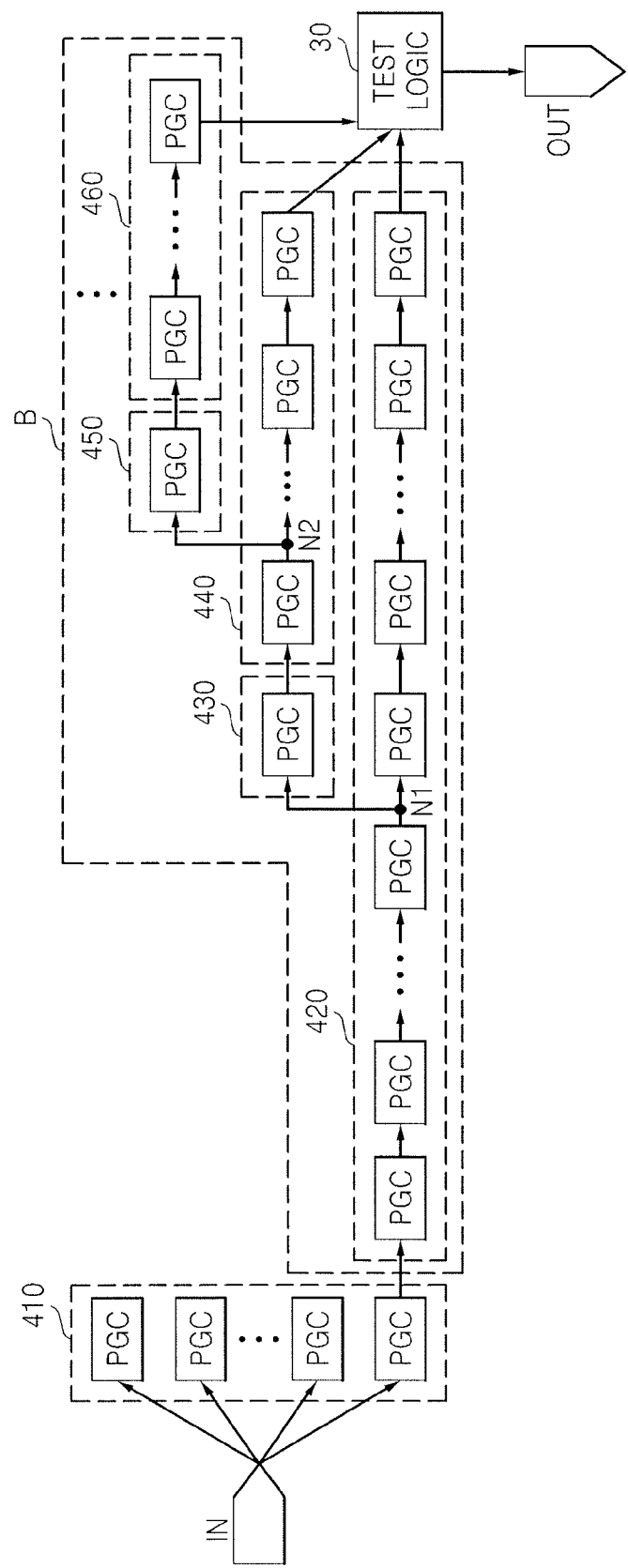
FIG. 4 illustrates a diagram showing the disposition and the signal flow of power gating cells included in a power control circuit according to further embodiments of the inventive concept.

FIG. 4 illustrates a diagram of the disposition and the signal flow of PGCs included in the power control circuit 10a according to other embodiments of the inventive concept. The power control circuit 10a may include a plurality of PGCs, which are connected with one another using a combination of serial and parallel connections.

In detail, the plurality of PGCs may include a plurality of first PGCs 410 receiving the mode change signal S_IN in parallel, a plurality of second PGCs 420 connected in series with one of the first PGCs 410, at least one third PGC 430 connected to a branch from a first node N1 between two adjacent second PGCs 420, and at least one fourth PGC 440 connected in series with the third PGC 430. The third and fourth PGCs 430 and 440 are connected in parallel with a second PGC 420 following the first node N1 among the second PGCs 420 connected in series with one another.

At this time, the second PGC 420 following the first node N1 and the fourth PGC 440 may output signals to the test logic 30 based on the mode change signal S_IN.

When a plurality of fourth PGCs 440 is provided, the power control circuit 10a may also include at least one fifth PGC 450 connected to a branch from a second node N2 between two adjacent fourth PGCs 440.

The power control circuit 10a may further include at least one sixth PGC 460 connected in series with the fifth PGC 450. At this time, the fifth and sixth PGCs 450 and 460 are connected in parallel with a fourth PGC 440 following the second node N2 among the fourth PGCs 440 connected in series with one another.

At this time, the second PGC 420 following the first node N1, the fourth PGC 440 following the second node N2, and the sixth PGC 460 may output signals to the test logic 30 based on the mode change signal S_IN.

The structure of PGCs illustrated in FIG. 4 is only an example and the inventive concept is not restricted thereto. Branching from a node may be further repeated. Like PGCs are connected through branching from the first node N1 between the second PGCs 420 and branching from the second node N2 between the fourth PGCs 440, branching from a node may be continued up to a certain number of times. The number of times of branching may be determined considering wake-up current that may occur at the transition from the sleep mode to the active mode.

As time elapses, the number of current switches that are turned on increases through more branches, but the wake-up current may be adjusted below maximum allowable current. This is because the amount of current decreases as a difference between a power supply voltage and a virtual power supply voltage decreases.

Time taken for mode transition can be reduced using the first PGC 410. In addition, testability can be increased by arranging PGCs adequately using a cascade connection.

The test logic 30 may perform an operation on output signals of PGCs and transmit a result value to the PMU 50. The test logic 30 may include an XOR register and perform an XOR operation.

When the test logic 30 performs an XOR operation and signal transmission is interrupted due to stuck fault at a branching point, a logic value of 1 may be output.

Referring to FIG. 4, the sum of the numbers of the second PGCs 420, the third PGCs 430, the fourth PGCs 440, the fifth PGCs 450 and the sixth PGCs 460 is greater than a predetermined value set for the operation of the power control circuit 10a. In other words, the number of all PGCs except for the first PGCs 410 is greater than the predetermined value.

The predetermined value may be determined depending on the minimum number of current switches necessary to maintain the proper operation of the power control circuit 10a. For instance, when "B" denotes the number of current switches included in all PGCs except for the first PGCs 410 and "C" denotes the minimum number of current switches necessary for the proper operation of the power control circuit 10a, B+1 may be greater than C.

When 1 is added to B, one of the first PGCs 410 is added. In other words, the number of first PGCs 410 only connected with the second PGC 420 is added to B. In the inventive concept, testability is secured for B+1 PGCs, which are enough to test current switches necessary in the active mode. According to current embodiments, since one of the first PGCs 410 is used to transit the mode change signal, 1 is added to B. In other words, only a number of first PGCs 410' connected with the second PGC 420 is added to B.

The number of the first PGCs 410 connected in parallel may be adjusted to adequately maintain the magnitude of wake-up current generated at the mode transition.

In detail, when "I" denotes saturation current of a current switch included in each of the PGCs and "W" denotes wake-up current, the number of the first PGCs 410 is less than W/I. In other words, the number of the first PGCs 410 is less than a value obtained by dividing the maximum allowable current of the power control circuit 10a by the maximum current flowing in the first PGCs 410.

A buffer of a voltage sensing circuit may be disposed between PGCs, which will be described later.

Figure 5:
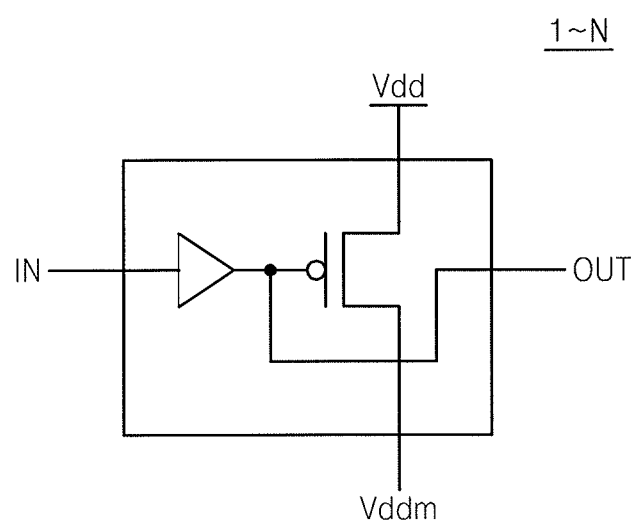
FIG. 5 illustrates an internal circuit diagram of a power gating cell according to some embodiments of the inventive concept.

FIG. 5 is an internal circuit diagram of a PGC 1~N according to some embodiments of the inventive concept.

Referring to FIG. 5, the PGCs 1~N may include a delay element and a power gating transistor. The delay element may be implemented by a buffer or an inverter. The power gating transistor may be implemented by a PMOS transistor or an NMOS transistor.

The power gating transistor functions as a current switch. In other words, the structure of the PGCs 1~N is not restricted to the current embodiment and may include any circuit functioning as a current switch. Referring to FIG. 5, a power supply voltage Vdd and a virtual power supply voltage Vddm may be connected to a drain and a source, respectively, of the PMOS transistor. The PMOS transistor may be turned on when the mode change signal S_IN is logic low and may be turned off when the mode change signal S_IN is logic high.

In other words, when the mode change signal S_IN is 0, the current switch is turned on and current flows from the drain to the source. The virtual power supply voltage Vddm nearly a ground voltage in the sleep mode is boosted up to the level of the power supply voltage Vdd by the flow of current.

The delay element is connected to an input terminal of the PMOS transistor so that the PGCs 1~N operate with a time difference, thereby reducing voltage noise occurring in a wake-up mode.

Figure 6A:
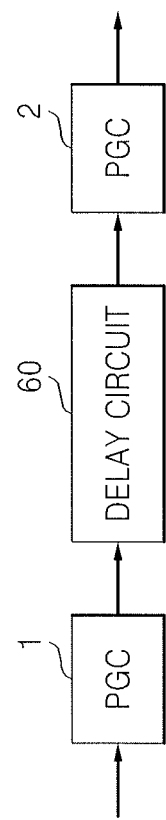
FIGS. 6A and 6B illustrate diagrams showing the disposition of a buffer included in a power control circuit according to some embodiments of the inventive concept.
Figure 6B:
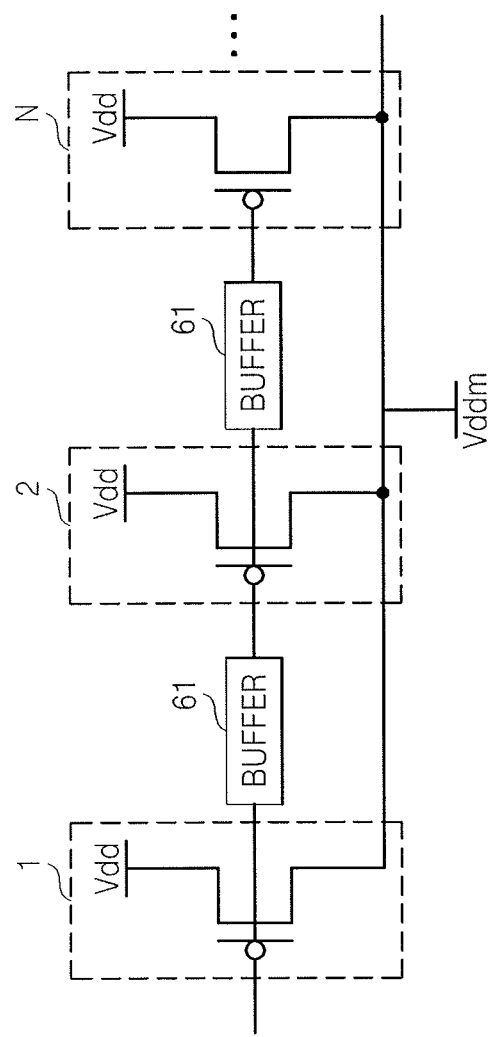
Figure 6C:
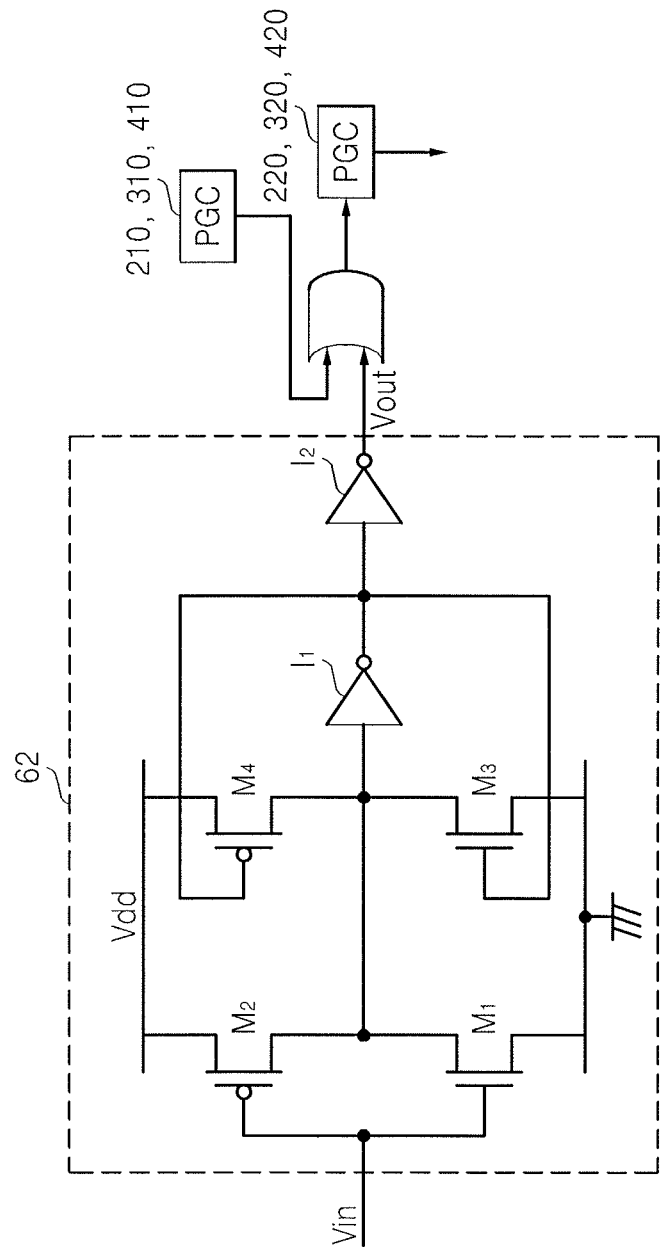
FIG. 6C illustrates a circuit diagram of a voltage sensing circuit included in a power control circuit according to some embodiments of the inventive concept.

FIGS. 6A through 6C are diagrams showing the disposition of a delay circuit 60 included in a power control circuit according to some embodiments of the inventive concept. The delay circuit 60 may be between adjacent PGCS, e.g., different PGCs or between the same PGCs connected in series. Further numerous delay circuits may be provided within a power control circuit.

At least one delay circuit 60 is disposed between the PGCs 1~N. The delay circuit 60 may be a buffer 61 (see FIG. 6B) or a voltage sensing circuit 62 (see FIG. 6C). The delay circuit 60 delays a signal when the virtual power supply voltage Vddm increases slowly, thereby adjusting the amount of current.

The buffer 61 is disposed between the PGCs 1~N to delay signal transmission. When the signal transmission is delayed, the on/off timing of the PGCs 1~N is adjusted, and therefore, current flow can be adjusted.

The voltage sensing circuit 62 may be implemented by a Schmitt trigger. When the virtual power supply voltage Vddm does not reach a certain level even though the virtual power supply voltage Vddm is provided to the voltage sensing circuit 62, the PGCs 1~N are disconnected from each other until the virtual power supply voltage Vddm reaches the certain level. In other words, when the virtual power supply voltage Vddm increases slower than expected, the voltage sensing circuit 62 may delay the current flow to prevent too much current from flowing.

Referring to FIG. 6C, the voltage sensing circuit 62 may include a plurality of NMOS transistors, a plurality of PMOS transistors, and two inverters. When a signal Vin (corresponding to the virtual power supply voltage Vddm) input to the voltage sensing circuit 62 is logic "1", a transistor M2 is turned off and a transistor M1 is turned on. As a result, logic "1" is input to transistors M3 and M4. Accordingly, the transistor M4 is turned off while the transistor M3 is turned on. As a result, logic "0" is input to an inverter I1 and the inverter I1 outputs logic "1" to an inverter I2. The inverter I2 receiving the logic "1" outputs logic "0". Accordingly, an output signal Vout is logic "0", which is input to an OR gate.

Meanwhile, logic "0" from the first PGC 210, 310, or 410 is also input to the OR gate.

In other words, only when the virtual power supply voltage Vddm is higher than a predetermined value, does the signal Vin have a value of logic "1". The voltage sensing circuit 62 recognizes the value of logic "1" and transmits the signal Vin to the second PGC 220, 320, or 420 only when the power supply voltage Vdd is higher than the predetermined value. Here, it is assumed that each PGC includes a PMOS transistor.

The voltage sensing circuit 62 illustrated in FIG. 6C is an example of a Schmitt trigger circuit and the structure of the circuit may be changed. The voltage sensing circuit 62 may be any circuit that transmits a signal to a PGC only when the virtual power supply voltage Vddm is higher than a predetermined value.

The voltage sensing circuit 62 or the buffer 61 may be disposed between the first PGC 210, 310, or 410 and the second PGC 220, 320, or 420 or may be disposed between any PGCs when necessary.

In particular, when the voltage sensing circuit 62 or the buffer 61 is disposed at a branching point in the power control circuit 10a illustrated in FIG. 4, the function of the voltage sensing circuit 62 or the buffer 61 may be significant.

In other words, the power control circuit 10a may also include the buffer 61 or the voltage sensing circuit 62 at each of the first and second nodes N1 and N2 respectively between the second PGC 420 and the third PGC 430, and between the fourth PGC 440 and the fifth PGC 450.

Figure 7A:
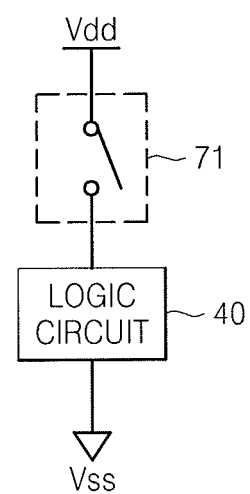
FIGS. 7A and 7B illustrate schematic block diagrams of a power gating cell according to some embodiments of the inventive concept.
Figure 7B:
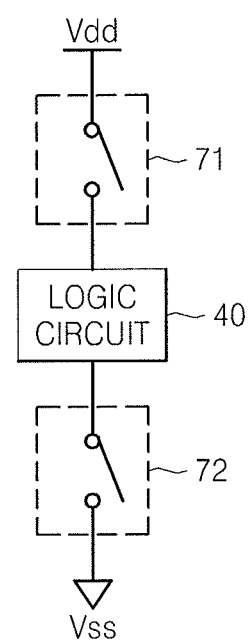

FIGS. 7A and 7B are schematic block diagrams of a PGC according to some embodiments of the inventive concept. Referring to FIGS. 7A and 7B, a power gating transistor switch 71 may be positioned between the logic circuit 40 and a power supply voltage Vdd. The power gating transistor switch 71 may include at least one PMOS transistor.

The logic circuit 40 may be positioned between the power supply voltage Vdd and a predetermined voltage Vss. The logic circuit 40 performs a predetermined logic operation. Power gating transistor switches 71 and 72 included in the PGC may switch the supply of the power supply voltage Vdd between the active mode and the sleep mode of the logic circuit 40.

The power gating transistor switches 71 and 72 may include different types of transistors according to their positions. In detail, when the power gating transistor switch 71 is positioned between the power supply voltage Vdd and the logic circuit 40, the power gating transistor switch 71 includes a PMOS transistor. However, when the power gating transistor switch 72 is positioned between the predetermined voltage Vss and the logic circuit 40, the power gating transistor switch 72 includes an NMOS transistor.

When the logic circuit 40 is in the active mode, the power gating enable signal S_IN is logic low and PMOS transistors are turned on. As a result, the power supply voltage Vdd is applied to the logic circuit 40.

Figure 8:
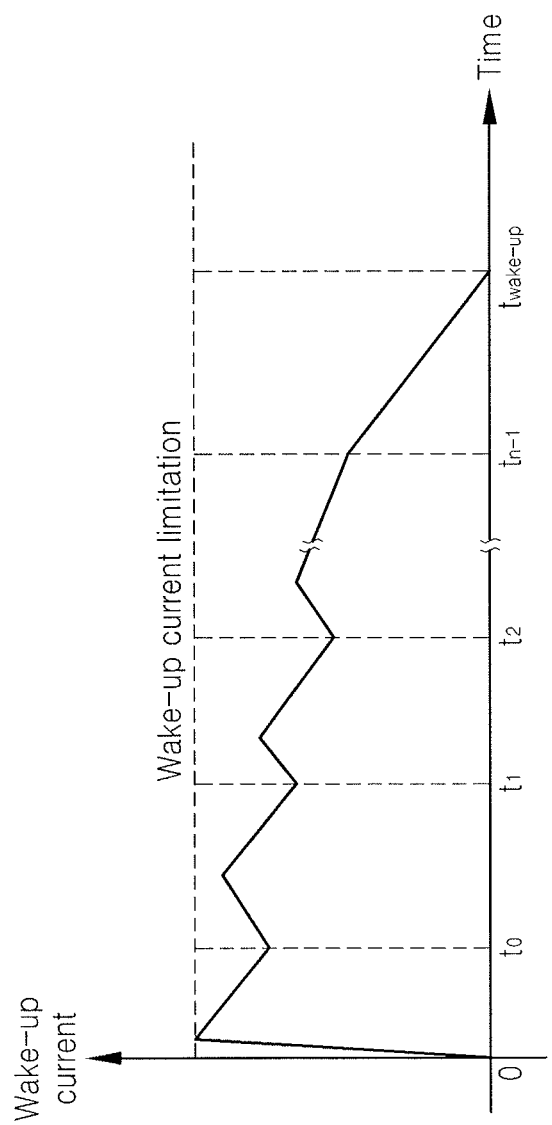
FIG. 8 illustrates a graph showing the change in current over time when a power control circuit is driven according to some embodiments of the inventive concept.

FIG. 8 is a graph showing the change in current over time during the operation of the power control circuit illustrated in FIG. 4. Referring to FIG. 8, when the first PGCs 410, which receive an external signal in parallel, are simultaneously turned on in response to the mode change signal S_IN, current rapidly flows in to reach an allowable level.

Up until a time point t0, a virtual power supply voltage increases and a potential difference between the virtual power supply voltage and a power supply voltage decreases, decreasing the current. Thereafter, the second PGCs 420 and the third PGC 430 are turned on, and therefore, current flow increases, increasing wake-up current.

When a certain level of current flows, the potential difference between the virtual power supply voltage and the power supply voltage decreases. As a result, the current flow decreases. At a time point t1, the third PGC 430 is branched from the first node N1 between second PGCs 420 and a fourth PGC 440 is connected in series with the third PGC 430. After the time point t1, the third and fourth PGCs 430 and 440 are turned on. As a result, the current flow increases and the overall wake-up current also increases.

When a certain level of current flows, the potential difference between the virtual power supply voltage and the power supply voltage decreases. As a result, the current flow decreases.

At a time point t2, the fifth PGC 450 is branched from the second node N2 between fourth PGCs 440 and a sixth PGC 460 is connected in series with the fifth PGC 450. After the time point t2, the fifth and sixth PGCs 450 and 460 are turned on. As a result, the current flow increases and the overall wake-up current also increases.

When a certain level of current flows, the potential difference between the virtual power supply voltage and the power supply voltage decreases. As a result, the current flow decreases.

At a time point to after the above process is repeated, the wake-up current becomes 0. In other words, the potential difference between the virtual power supply voltage and the power supply voltage converges to 0. Branching a PGC may be repeated until the wake-up current reaches 0. Here, "n" may be 1 or natural number greater than 1. When the wake-up current is 0, noise is reduced.

In other words, when PGCs are connected in parallel with each other, a large amount of current is allowed to flow at a time. Therefore, the potential difference between the virtual power supply voltage and the power supply voltage can be decreased. Accordingly, noise occurring at the transition from the sleep mode to the active mode or from the active mode to the sleep mode can be reduced within a short time.

Figure 9:
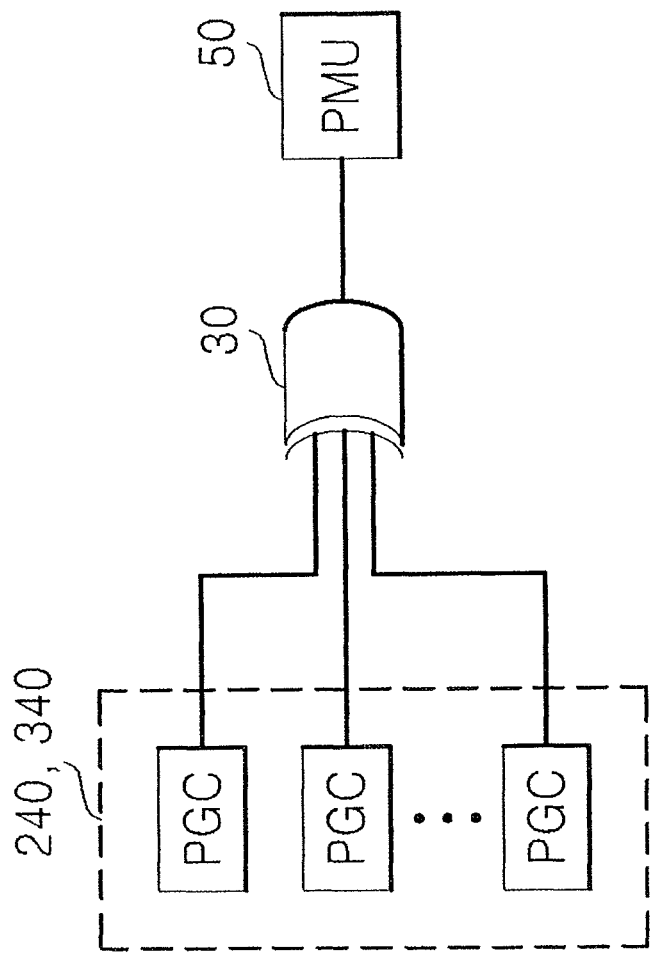
FIG. 9 illustrates a block diagram showing the connection of a power gating cell, a test logic, and a power management unit in a power control circuit according to some embodiments of the inventive concept.

FIG. 9 is a block diagram showing the connection of PGCs 240 or 340, the test logic 30, and the PMU 50 in a power control circuit according to some embodiments of the inventive concept.

Referring to FIG. 9, signals output from the fourth PGCs 240 or 340 at the end are transmitted to the test logic 30. An XOR register is illustrated as an example of the test logic 30 in FIG. 9.

Although it is illustrated in FIG. 9 that the fourth PGCs 240 or 340 output the signals to the test logic 30, it is just an example. The configuration of PGCs outputting signals to the test logic 30 may be changed with the relation between PGCs that can be connected with each other differently according to the logic circuit 40.

The test logic 30 receives the signals from the PGCs 240 or 340 and performs an operation on the signals.

Figure 10:
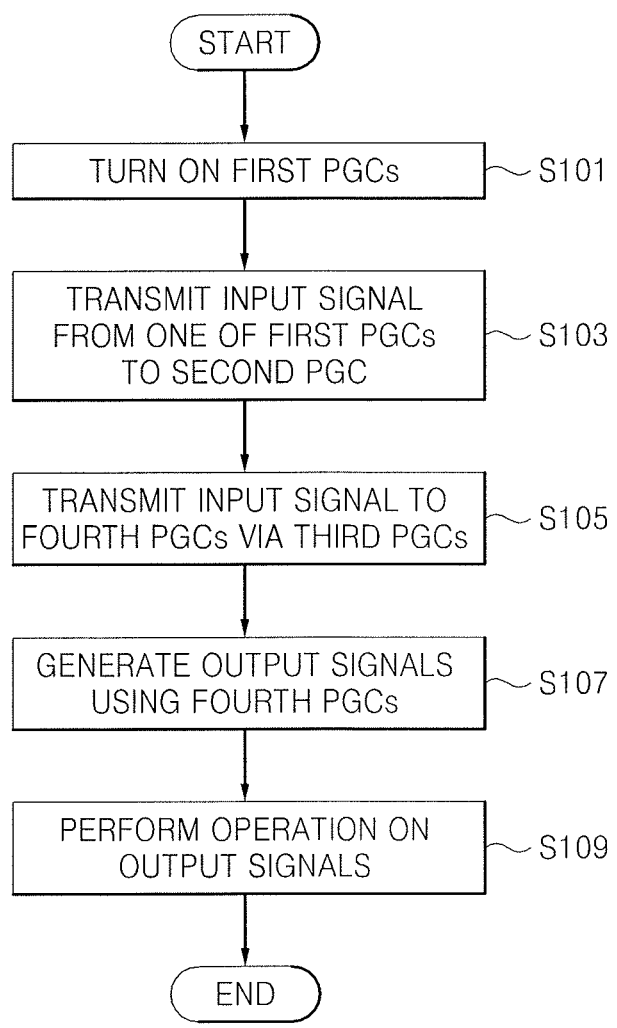
FIG. 10 illustrates a flowchart of a method of driving a power control circuit according to some embodiments of the inventive concept.

FIG. 10 is a flowchart of a method of driving a power control circuit according to some embodiments of the inventive concept.

Referring to the drawings, first power gating transistors respectively included in the first PGCs 210 are simultaneously turned on in operation S101. This is because the first PGCs 210 simultaneously receive the mode change signal S_IN in parallel.

Thereafter, one of the first PGCs 210 transmits the mode change signal S_IN to the second PGC 220 in operation S103. The second PGC 220 transmits the mode change signal S_IN to a third PGC 230 in operation S105. The fourth PGCs 240 output signals based on the mode change signal S_IN received from a third PGC 230 in operation S107. The test logic 30 performs an operation on the signals and transmits an operation result to the PMU 50 in operation S109.

In this method, a plurality of the first PGCs 210 simultaneously receives the mode change signal S_IN. Accordingly, current switches included in the first PGCs 210 can be simultaneously turned on or off. For instance, at the transition from the sleep mode to the active mode, the current switches are turned on at the same time, thereby simultaneously allowing current to flow to the logic circuit 40.

Conventionally, PGCs are connected in series with each other, so that current switches are sequentially turned on. Accordingly, the transition from the sleep mode to the active mode takes a long time.

However, according to some embodiments of the inventive concept, PGCs receive the mode change signal S_IN in parallel and simultaneously supply current, thereby reducing the time taken to change an operation mode. The number of the first PGCs 210 connected in parallel with each other may be adjusted so that a wake-up current generated at mode transition is adequately adjusted.

In detail, when "I" denotes saturation current of a current switch included in each of the PGCs and "W" denotes wake-up current, the number of the first PGCs 210 is less than W/I. In other words, the number of the first PGCs 210 is less than a value obtained by dividing the maximum allowable current of the power control circuit 10a by the maximum current flowing in the first PGCs 210.

In addition, only one of the first PGCs 210 may be connected with the second PGC 220. It is sufficient that the test logic 30 provides a result of performing an operation on the connection with only one first PGC 210.

When the number of the first PGCs 210 that are simultaneously turned on decreases, the wake-up current also decreases. The limitation of the wake-up current can be secured even if a problem occurs in first PGCs 210 that are not connected with the second PGC 220.

The second PGC 220 is connected with one of the first PGCs 210 and receives the mode change signal S_IN input to the first PGC 210. When the mode change signal S_IN is input to the second PGC 220, a current switch included in the second PGC 220 is turned on or off.

A plurality of the second PGCs 320 may be provided. The second PGCs 320 may be connected with one of the first PGCs 310 and may simultaneously receive a signal from the first PGC 310. Current switches included in the second PGCs 320, which simultaneously receive the signal, may be turned on or off at the same time. For instance, when the second PGCs 320 are turned on at the same time, currents are simultaneously supplied to the logic circuit 40 via the current switches.

Third PGCs 330 may be connected in series with at least one of the second PGCs 320. When a plurality of the second PGCs 320 are provided, a plurality of third PGCs 330 may be respectively connected in series with the plurality of the second PGCs 320.

Fourth PGCs 340 are connected with a third PGC 330 positioned at the end of a serial connection of the plurality of the third PGCs 330. The fourth PGCs 340 receive the mode change signal S_IN transmitted via the first PGC 310, the second PGC 320, and the third PGCs 330. Each of the fourth PGCs 340 outputs a signal based on the mode change signal S_IN.

The method may also include the operation of delaying the transmission of the mode change signal S_IN based on a predetermined delay value.

Figure 11:
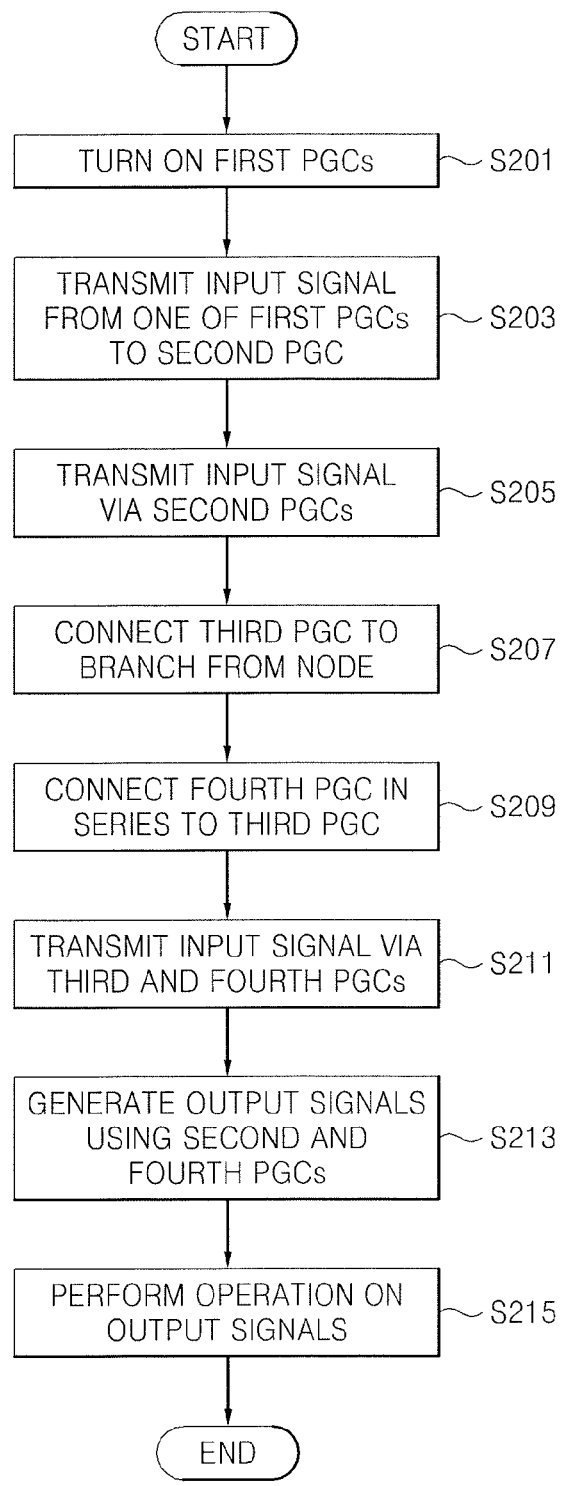
FIG. 11 illustrates a flowchart of a method of driving a power control circuit according to other embodiments of the inventive concept.

FIG. 11 is a flowchart of a method of driving a power control circuit according to other embodiments of the inventive concept.

Referring to the drawings, first power gating transistors respectively included in the first PGCs 410 are simultaneously turned on in operation S201. This is because the first PGCs 410 simultaneously receive the mode change signal S_IN in parallel.

Thereafter, one of the first PGCs 410 transmits the mode change signal S_IN to a second PGC 420 in operation S203. The mode change signal S_IN is transmitted via at least one second PGC 420 connected in series with each other in operation S205. The third PGC 430 is connected to a branch from a node between second PGCs 420 in operation S207. A fourth PGC 440 is connected in series with the third PGC 430 in operation S209. The mode change signal S_IN is transmitted via the third and fourth PGCs 430 and 440 in operation S211. A second PGC 420 at the end of a serial connection of a plurality of second PGCs 420 and a fourth PGC 440 at the end of a serial connection of a plurality of fourth PGCs 440 output signals based on the mode change signal S_IN in operation S213. The output signals are transmitted to the test logic 30. The test logic 30 may perform an XOR operation on the output signals, thereby testing the connection of PGCs in operation S215.

Furthermore, the fifth PGC 450 may be connected to a branch from a node between fourth PGCs 440 and may be connected in series with a sixth PGC 460. In this manner, connecting additional PGC to a branch from a node between PGCs connected in series with each other can be repeated many times.

When the fifth PGC 450 is connected to the branch from the node between the fourth PGCs 440, a sixth PGC 460 at the end of a serial connection of a plurality of sixth PGCs 460, the second PGC 420 at the end of the serial connection of the second PGCs 420, and the fourth PGC 440 at the end of the serial connection of the fourth PGCs 440 are connected to the test logic 30. Accordingly, the second, fourth and sixth PGCs 420, 440, and 460 at the ends, respectively, of the serial connections may output signals to the test logic 30 based on the mode change signal S_IN.

The test logic 30 may perform an XOR operation on the output signals, thereby testing the connection of PGCs.

The method of a power control circuit according to some embodiments of the inventive concept can be embodied as program instructions that can be executed using various types of computers and recorded in a computer readable medium.

The computer readable medium may include a program instruction, a data file, or a data structure individually or a combination thereof. The program instruction recorded in the medium may be specially designed and configured for the inventive concept or may have already been known to and available to those of skill in the art of computer software. Examples of the computer readable medium include tangible, non-transitory media and devices, e.g., magnetic media such as hard disks, floppy disks and magnetic tapes; optical media such as CD-ROMs and DVDs; magneto-optical media such as floptical disks; and hardware devices such as read-only memory (ROM) devices, random-access memory (RAM) devices and flash memory devices that are specially configured to store and execute program instructions. Examples of the program instruction include machine codes created by a compiler and high-level language codes that can be executed in a computer using an interpreter. The hardware devices may be embodied as at least one software module configured to perform operations according to some embodiments of the inventive concept and vice versa is possible.

Figure 12:
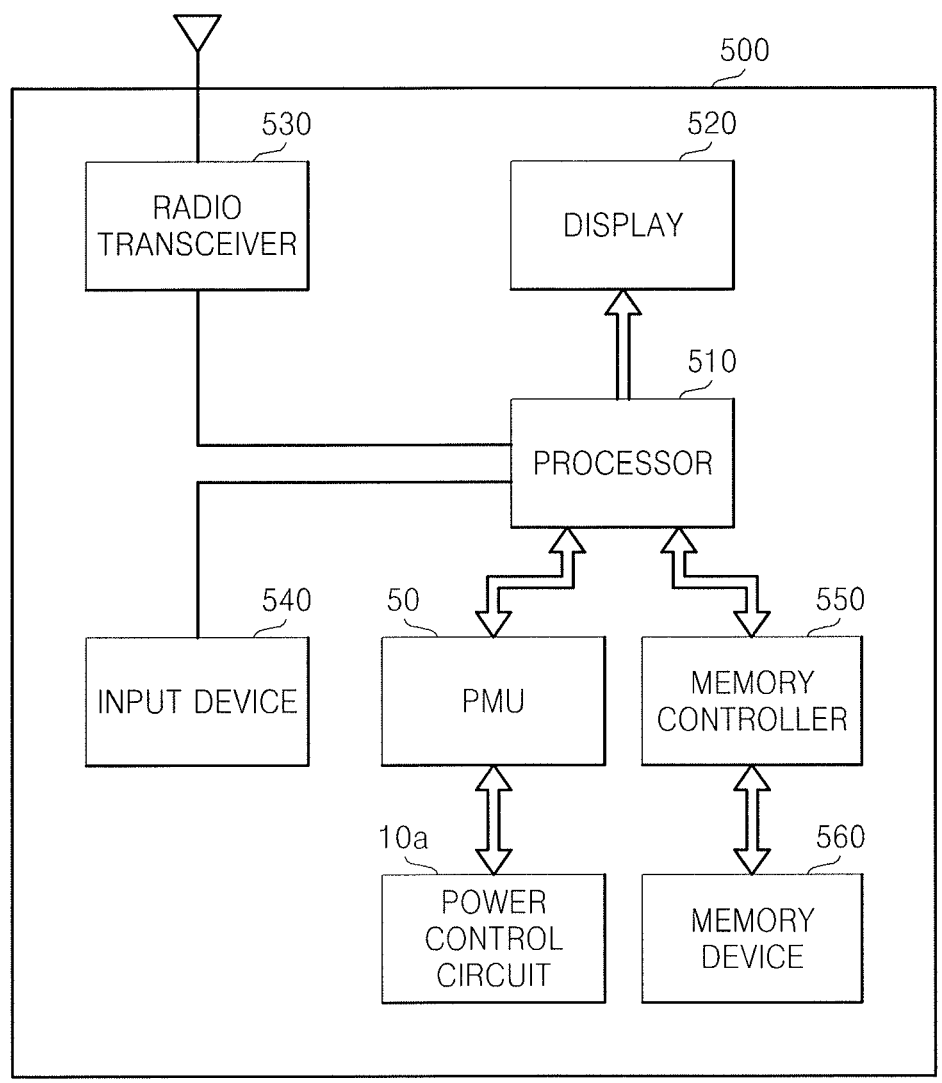
FIG. 12 illustrates a block diagram of a semiconductor system including the power control circuit illustrated in FIG. 1A according to some embodiments of the inventive concept.

FIG. 12 is a block diagram of a semiconductor system 500 including the power control circuit 10a illustrated in FIG. 1A. Referring to FIG. 12, the semiconductor system 500 may be implemented as a cellular phone, a smart phone, a personal digital assistant (PDA), a radio communication system, etc.

The semiconductor system 500 includes a memory device 560 and a memory controller 550 controlling the operations of the memory device 560. The memory controller 550 may control the data access operation, e.g., a program operation, an erase operation, or a read operation, of the memory device 560 according to the control of a processor 510. A program-verify operation may be included in the program operation.

Page data programmed in the memory device 560 may be displayed through a display 520 according to the control of the processor 510 and the memory controller 550.

A radio transceiver 530 transmits or receives radio signals through an antenna. The radio transceiver 530 may convert radio signals received through the antenna into signals that can be processed by the processor 510.

Accordingly, the processor 510 may process the signals output from the radio transceiver 530 and transmit the processed signals to the memory controller 550 or the display 520. The memory controller 550 may program the signals processed by the processor 510 to the memory device 560.

The radio transceiver 530 may also convert signals output from the processor 510 into radio signals and outputs the radio signals to an external device through the antenna.

An input device 540 enables control signals for controlling the operation of the processor 510 or data to be processed by the processor 510 to be input to the semiconductor system 500. The input device 540 may be implemented by a pointing device such as a touch pad or a computer mouse, a keypad, or a keyboard.

The processor 510 may control the operation of the display 520 to display data output from the memory controller 550, data output from the radio transceiver 530, or data output from the input device 540. The memory controller 550, which controls the operations of the memory device 560, may be implemented as a part of the processor 510 or as a separate chip.

The PMU 50 may transmit the mode change signal S_IN to the power control circuit 10a. The mode change signal S_IN is a signal for commanding to make transition from the sleep mode to the active mode or from the active mode to the sleep mode and may be a power gating enable signal. The on/off of a PGC is determined by the mode change signal S_IN.

Referring back to FIG. 1A, the power control circuit 10a may include the power gating block 20a and the test logic 30. The test logic 30 performs an operation on a signal transmitted via a PGC.

The PMU 50 may compare the mode change signal S_IN with the signal S_OUT received from the test logic 30 and determine which PGC has had a stuck fault. In other words, the PMU 50 may test the connection of PGCs using the output signal S_OUT.

Power consuming elements included in the semiconductor system 500 may be elements included in the logic circuit 40. Accordingly, the power consumption of the semiconductor system 500 can be minimized using the power control circuit 10a.

For instance, when the display 520 is not used, PGCs included in the power control circuit 10a do not provide an external power supply voltage to the display 520. In addition, the power control circuit 10a quickens transition from the sleep mode to the active mode.

Figure 13:
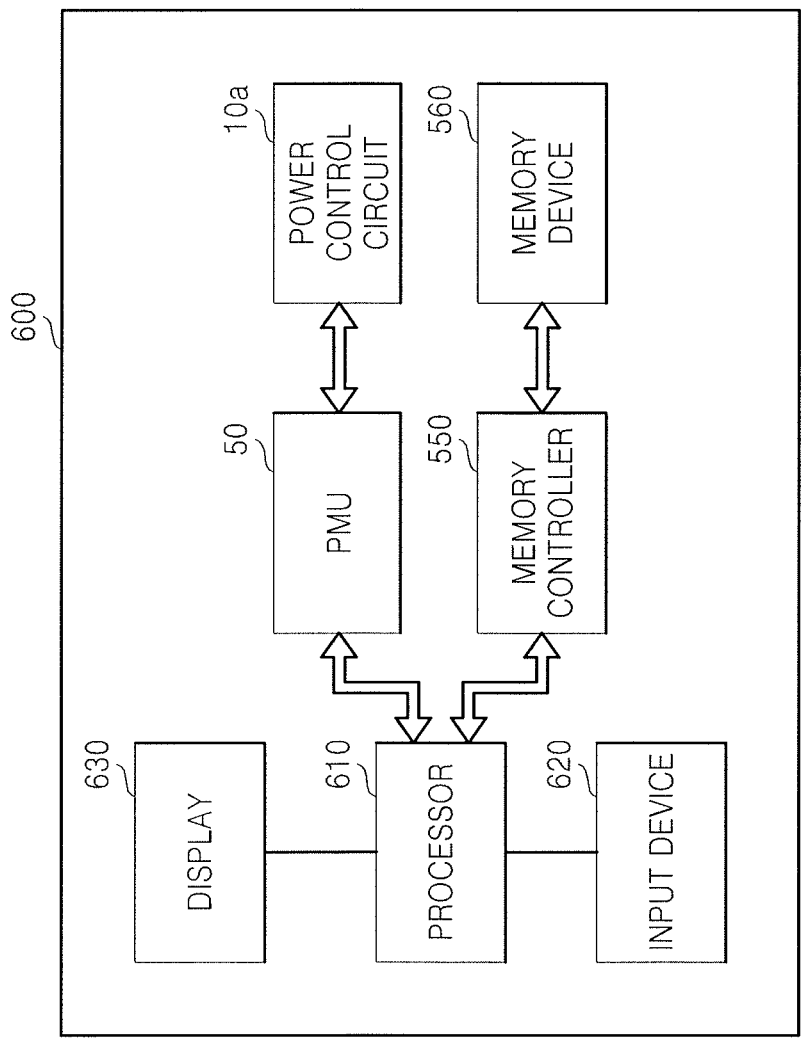
FIG. 13 illustrates a block diagram of a semiconductor system including the power control circuit illustrated in FIG. 1A according to other embodiments of the inventive concept.

FIG. 13 is a block diagram of a semiconductor system including the power control circuit 10a illustrated in FIG. 1A according to other embodiments of the inventive concept. Referring to FIG. 13, the semiconductor system 600 may be implemented as a personal computer (PC), a tablet PC, a net-book, an e-reader, a personal digital assistant (PDA), a portable multimedia player (PMP), an MP3 player, an MP4 player, etc.

The memory system 600 includes the memory device 560 and a memory controller 550 controlling the data processing operations of the memory device 560. A processor 610 may display data stored in the memory device 560 through a display 630 according to data input through an input device 620. The input device 620 may be implemented by a pointing device such as a touch pad or a computer mouse, a keypad, or a keyboard.

The processor 610 may control the overall operation of the memory system 600 and the operations of the memory controller 550. The memory controller 550, which may control the operations of the memory device 560, may be implemented as a part of the processor 610 or as a separate chip.

The PMU 50 may transmit the mode change signal S_IN to the power control circuit 10a. The mode change signal S_IN is a signal for commanding to make transition from the sleep mode to the active mode or from the active mode to the sleep mode and may be a power gating enable signal. The on/off of a PGC is determined by the mode change signal S_IN.

Referring back to FIG. 1A, the power control circuit 10a may include the power gating block 20a and the test logic 30. The test logic 30 performs an operation on a signal transmitted via a PGC.

The PMU 50 may compare the mode change signal S_IN with the signal S_OUT received from the test logic 30 and determine which PGC has had a stuck fault. In other words, the PMU 50 may test the connection of PGCs using the output signal S_OUT.

Figure 14:
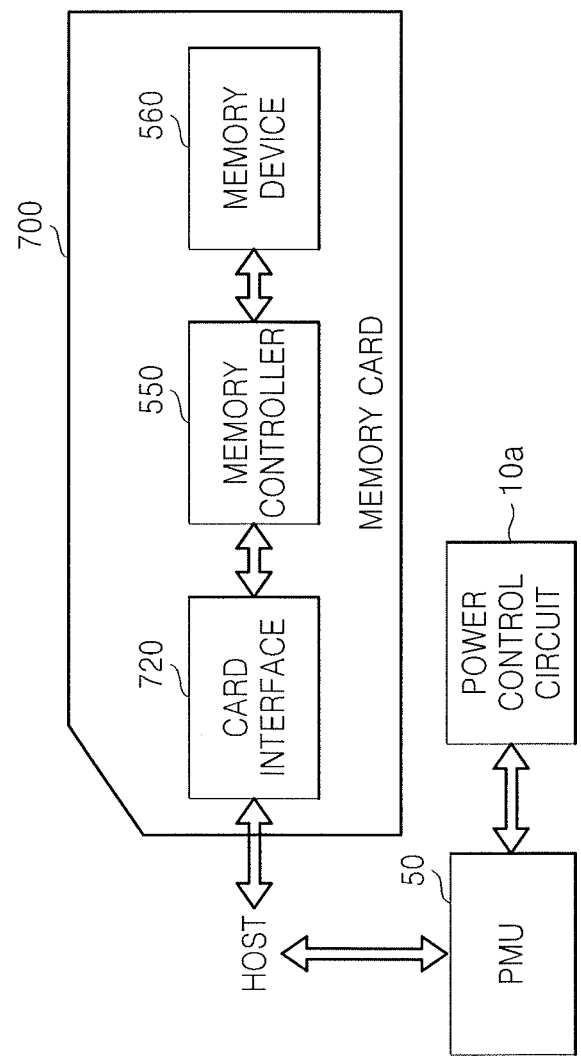
FIG. 14 illustrates a block diagram of a semiconductor system including the power control circuit illustrated in FIG. 1A according to yet other embodiments of the inventive concept.

FIG. 14 is a block diagram of a semiconductor system including the power control circuit illustrated in FIG. 1A according to yet other embodiments of the inventive concept. Referring to FIG. 14, the semiconductor system 700 may be implemented as a memory card, a smart card, etc. The memory system 700 includes the memory device 560, the memory controller 550, and a card interface 720.

The memory controller 550 may control data exchange between the memory device 560 and the card interface 720. The card interface 720 may be a secure digital (SD) card interface, a multi-media card (MMC) interface, etc.

The card interface 720 may interface a host and the memory controller 550 for data exchange according to a protocol of the host. The card interface 720 may support a universal serial bus (USB) protocol and an interchip (IC)-USB protocol. Here, the card interface 720 may indicate a hardware supporting a protocol used by the host, a software installed in the hardware, or a signal transmission mode.

When the memory system 700 is connected with a host, e.g., a PC, a tablet PC, a digital camera, a digital audio player, a cellular phone, a console video game hardware, a digital set-top box, etc., the host may perform data communication with the memory device 560 through the card interface 720 and the memory controller 550.

The PMU 50 may transmit the mode change signal S_IN to the power control circuit 10a. The mode change signal S_IN is a signal for commanding to make transition from the sleep mode to the active mode or from the active mode to the sleep mode and may be a power gating enable signal. The on/off of a PGC is determined by the mode change signal S_IN.

Referring back to FIG. 1A, the power control circuit 10a may include the power gating block 20a and the test logic 30. The test logic 30 performs an operation on a signal transmitted via a PGC.

The PMU 50 may compare the mode change signal S_IN with the signal S_OUT received from the test logic 30 and determine which PGC has had a stuck fault. In other words, the PMU 50 may test the connection of PGCs using the output signal S_OUT.

Figure 15:
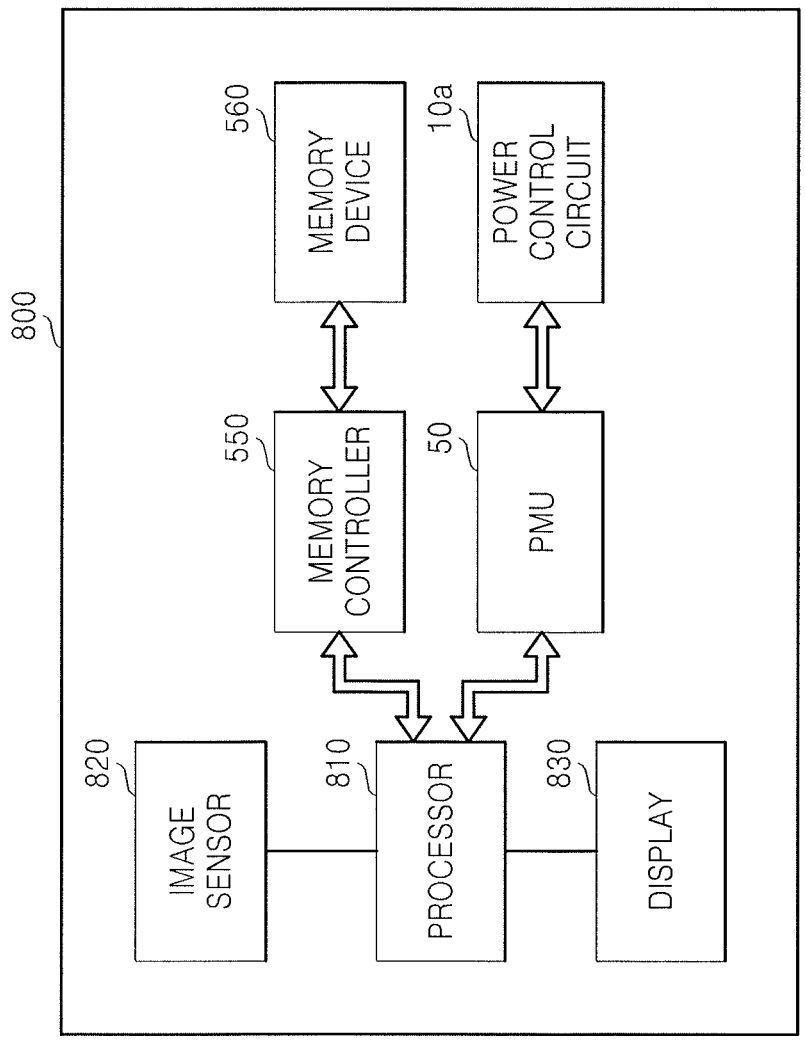
FIG. 15 illustrates a block diagram of a semiconductor system including the power control circuit illustrated in FIG. 1A according to still other embodiments of the inventive concept.

FIG. 15 is a block diagram of a semiconductor system including the power control circuit 10a illustrated in FIG. 1A according to still other embodiments of the inventive concept. Referring to FIG. 15, the semiconductor system 500 may be implemented as an image processing apparatus, e.g., a digital camera, a cellular phone equipped with a digital camera, a smart phone equipped with a digital camera, a tablet PC equipped with a digital camera, etc.

The memory system 800 includes the memory device 560 and the memory controller 550 controlling the data processing operations, such as a program operation, an erase operation, and a read operation, of the memory device 560. An image sensor 820 included in the memory system 800 converts optical images into digital signals and outputs the digital signals to a processor 810 or the memory controller 550. The digital signals may be controlled by the processor 810 to be displayed through a display 830 or stored in the memory device 560 through the memory controller 550.

Data stored in the memory device 560 may be displayed through the display 830 according to the control of the processor 810 or the memory controller 550. The memory controller 550, which may control the operations of the memory device 560, may be implemented as a part of the processor 810 or as a separate chip.

The PMU 50 may transmit the mode change signal S_IN to the power control circuit 10a. The mode change signal S_IN is a signal for commanding to make transition from the sleep mode to the active mode or from the active mode to the sleep mode and may be a power gating enable signal. The on/off of a PGC is determined by the mode change signal S_IN.

Referring back to FIG. 1A, the power control circuit 10a may include the power gating block 20a and the test logic 30. The test logic 30 performs an operation on a signal transmitted via a PGC.

The PMU 50 may compare the mode change signal S_IN with the signal S_OUT received from the test logic 30 and determine which PGC has had a stuck fault. In other words, the PMU 50 may test the connection of PGCs using the output signal S_OUT.

As described above, according to some embodiments of the inventive concept, testability is improved and noise is minimized by changing the structure of PGCs included in a power control circuit.

In addition, PGCs that first receive an input signal in the power control circuit are connected in parallel with each other, thereby reducing mode transition time. Additional PGCs are connected in series as well as in parallel, so that the testability is improved and the structure of a test logic is simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A power control circuit connected between a power supply voltage and a logic circuit, the power control circuit switching power supplied to the logic circuit, the power control circuit comprising:
   a plurality of first power gating cells configured to receive an external mode change signal in parallel;
   at least one second power gating cell connected with one first power gating cell of the plurality of the first power gating cells;
   a plurality of third power gating cells connected in series with the at least one second power gating cell; and
   a plurality of fourth power gating cells connected in parallel with a third power gating cell at an end of a serial connection of the plurality of the third power gating cells,
   wherein the mode change signal is transmitted to the plurality of fourth power gating cells via the one first power gating cell, the at least one second power gating cell and the plurality of third power gating cells, and
   each of the first through fourth power gating cells switches the power supplied in response to the mode change signal.

2. The power control circuit as claimed in claim 1, further comprising a buffer connected between the at least one second power gating cell and the plurality of third power gating cells to delay transmission of the mode change signal.

3. The power control circuit as claimed in claim 2, further comprising a buffer connected between the plurality of third power gating cells and a buffer connected between the plurality of third power gating cells and the plurality of fourth power gating cells to delay transmission of the mode change signal.

4. The power control circuit as claimed in claim 1, wherein the at least one second power gating cells includes a plurality of second power gating cells, and wherein the plurality of third power gating cells are divided into groups that are connected in series with the plurality of second power gating cells, respectively.

5. The power control circuit as claimed in claim 1, further comprising a test logic configured to be connected with the plurality of fourth power gating cells, to receive output signals of the respective fourth power gating cells, and to perform an operation on the output signals.

6. The power control circuit as claimed in claim 5, wherein the test logic comprises a logic operator configured to perform an XOR operation on the output signals of the respective fourth power gating cells.

7. The power control circuit as claimed in claim 1, further comprising a voltage sensing circuit connected between the one first power gating cell and the at least one second power gating cell to control connection between the one first power gating cell and the at least one second power gating cell based on a predetermined reference value.

8. The power control circuit as claimed in claim 1, wherein a number of the second through fourth power gating cells is greater than a predetermined value set for an operation of the power control circuit.

9. The power control circuit as claimed in claim 1, wherein a number of the plurality of first power gating cells is less than a value obtained by dividing a maximum allowable current of the power control circuit by a maximum current flowing in the plurality of first power gating cells.

10. A power control circuit, which is connected between a power supply voltage and a logic circuit, the power control circuit switching power supplied to the logic circuit, the power control circuit comprising:
a plurality of first power gating cells configured to receive an external mode change signal in parallel;
a plurality of second power gating cells connected in series with one first power gating cell among the plurality of first power gating cells;
at least one third power gating cell connected to a branch from a first node between the plurality of second power gating cells; and
at least one fourth power gating cell connected in series with the at least one third power gating cell,
wherein the third and fourth power gating cells are connected in parallel with a second power gating cell following the first node in a serial connection of the plurality of second power gating cells, and
each of the first through fourth power gating cells switches the power supplied in response to the mode change signal.

11. The power control circuit as claimed in claim 10, wherein the second power gating cell following the first node and the at least one fourth power gating cell respectively output signals based on the mode change signal.

12. The power control circuit as claimed in claim 10, further comprising a buffer connected between the plurality of first power gating cells and the plurality of second power gating cells to delay transmission of the mode change signal.

13. The power control circuit as claimed in claim 12, further comprising a buffer connected between the plurality of second power gating cells or between the at least one third power gating cell and the at least one fourth power gating cell to delay transmission of the mode change signal.

14. The power control circuit as claimed in claim 10, wherein the at least one fourth power gating cell includes a plurality of fourth power gating cells, and further comprising at least one fifth power gating cell connected to a branch from a second node between the plurality of fourth power gating cells.

15. The power control circuit as claimed in claim 10, further comprising a test logic configured to be connected with the second and fourth power gating cells, to receive output signals of the respective second and fourth power gating cells, and to perform an operation on the output signals.

16. A semiconductor device comprising the power control circuit as claimed in claim 10.

17. A power control circuit connected between a power supply voltage and a logic circuit, the power control circuit switching power supplied to the logic circuit, the power control circuit comprising:
a first plurality of first power gating cells configured to receive an external mode change signal in parallel;
at least one second power gating cell connected with one first power gating cell of the plurality of the first power gating cells;
at least one third power gating cell connected with the at least one second power gating cell; and
at least one fourth power gating cell connected with the at least one third power gating cell,
wherein at least one of the at least one second power gating cell includes a second plurality of second gating cells, the at least one third power gating cells includes a third plurality of third gating cells, and the at least one fourth power gating cell includes a fourth plurality of fourth gating cells,
wherein at least one of the second, third, and fourth pluralities has power gating cells connected in series, and
wherein each of the first through fourth power gating cells switches the power supplied in response to the mode change signal.

18. The power control circuit as claimed in claim 17, wherein the at least one second power gating cell includes the second plurality of second power gating cells connected in series with the one first power gating cell.

19. The power control circuit as claimed in claim 18, wherein the at least one third power gating cell is connected to a branch from a first node between adjacent second power gating cells of the plurality of second power gating cells.

20. The power control circuit as claimed in claim 17, wherein the at least one third power gating cell includes the third plurality of third power gating cells connected in series with the at least one second power gating cell.

* * * * *